(12) United States Patent
Chang

(10) Patent No.: US 10,128,103 B2
(45) Date of Patent: Nov. 13, 2018

(54) APPARATUS AND PROCESS FOR WAFER CLEANING

(71) Applicant: TAIWAN SEMICONDUCTOR MANUFACTURING CO., LTD., Hsinchu (TW)

(72) Inventor: Yuan-Chang Chang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/191,206

(22) Filed: Feb. 26, 2014

(65) Prior Publication Data

US 2015/0243495 A1 Aug. 27, 2015

(51) Int. Cl.
| | | |
|---|---|---|
| *B08B 7/00* | (2006.01) | |
| *H01L 21/02* | (2006.01) | |
| *H01L 21/67* | (2006.01) | |
| *B08B 3/00* | (2006.01) | |
| *B08B 3/02* | (2006.01) | |
| *B08B 1/00* | (2006.01) | |
| *B08B 5/00* | (2006.01) | |
| *B08B 5/02* | (2006.01) | |
| *B08B 3/04* | (2006.01) | |
| *B08B 5/04* | (2006.01) | |

(52) U.S. Cl.
CPC .. *H01L 21/02087* (2013.01); *H01L 21/02052* (2013.01); *H01L 21/6704* (2013.01); *H01L 21/67046* (2013.01); *B08B 1/00* (2013.01); *B08B 1/002* (2013.01); *B08B 3/00* (2013.01); *B08B 3/024* (2013.01); *B08B 3/04* (2013.01); *B08B 5/00* (2013.01); *B08B 5/02* (2013.01); *B08B 5/04* (2013.01)

(58) Field of Classification Search
CPC .. B08B 1/00; B08B 1/002; B08B 3/00; B08B 3/02; B08B 3/024; B08B 3/04; B08B 5/00; B08B 5/02; B08B 5/04; H01L 21/02087; H01L 21/02052; H01L 21/6704; H01L 21/67046
See application file for complete search history.

(56) References Cited

U.S. PATENT DOCUMENTS 6,550,091 B1 * 4/2003 Radman et al. .................. 15/77
6,951,042 B1 * 10/2005 Mikhaylichenko et al. ..... 15/77
(Continued)

OTHER PUBLICATIONS

Application as filed and the Electronic Acknowledgement Receipt for U.S. Appl. No. 13/795,859 dated Mar. 12, 2013.

*Primary Examiner* — Sharidan Carrillo
(74) *Attorney, Agent, or Firm* — McDermott Will & Emery LLP

(57) ABSTRACT

A process and apparatus for cleaning a wafer, the wafer having a front side and a back side, are provided. The process begins with placing the wafer on a platform, and a first gas stream delivering in a direction from a center to an edge of the front side of the wafer. The first gas stream prevents liquid drops entering a work piece region on the front side of the wafer and protects the integrity of the integrated circuits. A cleaning brush is rinsed by a first liquid stream and contacting the edge of the wafer for cleaning the wafer. The cleaning brush scrubs unwanted residual materials from the edge of the wafer, and the first liquid stream flushes the cleaning brush to recover the cleaning ability.

20 Claims, 5 Drawing Sheets

(56) References Cited

U.S. PATENT DOCUMENTS

| | | | |
|---|---|---|---|
| 7,364,626 B2* | 4/2008 | Hirose et al. | 134/2 |
| 2006/0096048 A1* | 5/2006 | Mikhaylichenko et al. | 15/77 |
| 2006/0266383 A1* | 11/2006 | Tran et al. | 134/34 |
| 2007/0175501 A1* | 8/2007 | Amai et al. | 134/149 |
| 2007/0246079 A1* | 10/2007 | Pham | H01L 21/6708 134/26 |
| 2008/0053487 A1* | 3/2008 | Goto et al. | 134/32 |
| 2008/0212049 A1* | 9/2008 | Fukutomi et al. | 355/30 |
| 2009/0050177 A1* | 2/2009 | Nagayasu et al. | 134/6 |
| 2009/0202951 A1* | 8/2009 | Yamamoto et al. | 430/322 |
| 2010/0075054 A1* | 3/2010 | Kaneyama et al. | 427/331 |

* cited by examiner

APPARATUS AND PROCESS FOR WAFER CLEANING

BACKGROUND

The semiconductor integrated circuit industry has experienced exponential growth. Technological progresses have produced smaller and more complex circuits than the previous generation. In the evolution of the integrated circuit industry, functional density generally increased while geometry size decreased. This scaling down process increases production efficiency and reduces manufacturing costs. Such scaling down also increases the complexity of integrated circuit processing and manufacturing. For these advances to be realized, similar developments in integrated circuit processing and manufacturing are needed.

A common requirement in current advanced integrated circuit processing is a wafer cleaning process. Particles or films are left on the surface of a wafer for subsequent fabrication operations; however, the unwanted residual materials may cause, among other things, defects such as scratches on the wafer surface and inappropriate interactions between metalization features. Usually, the unwanted residual materials are substances such as metals, environmental gas components, and moisture. In some cases, such defects on the wafer surface may cause reduced yield or breakage of integrated circuit devices. In order to avoid the undue costs for discarding wafer having inoperable devices, it is necessary to clean the wafer adequately yet efficiently after fabrication operations that may leave unwanted residue on the surface of the wafer.

During a cleaning process of the wafer, the unwanted residual materials aggregated into particles near an edge of the wafer are difficult to remove. Standard cleaning techniques fail to sufficiently clean and remove these particles from the wafer. The unwanted particles on the edge of the wafer may flake off to a work piece region of the wafer, causing the reduced device yield or destructing the integrity of the integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
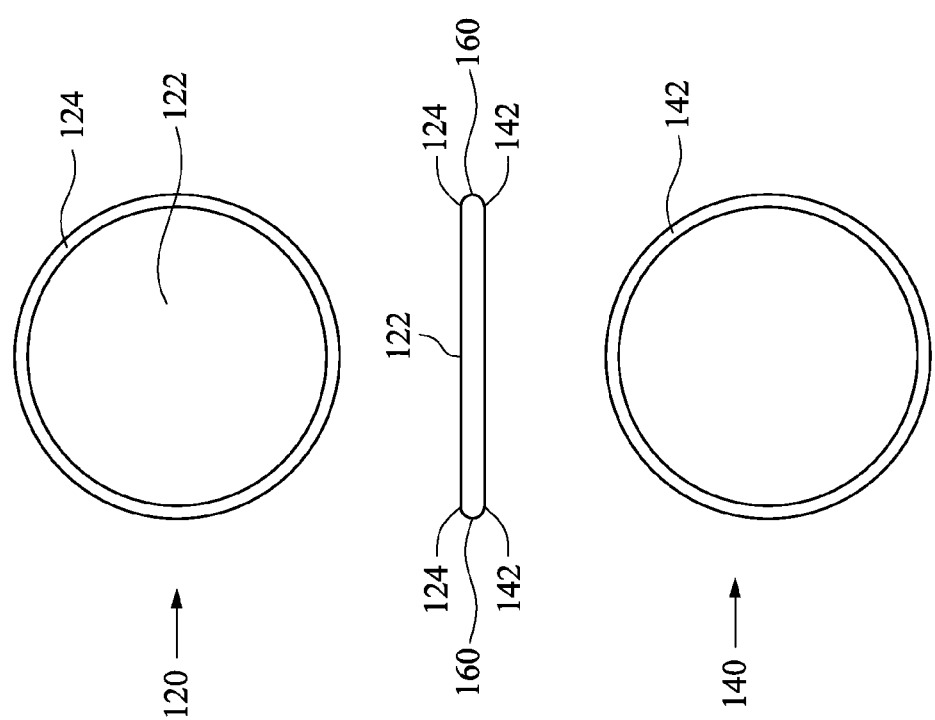
FIG. 1 is a front side view, a cross-sectional view, and a back side view of a wafer in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

General wafer cleaning process begins with delivering a liquid stream to fully rinse a front side of a wafer, and a brush or a scrubber is applied to clean an edge of the wafer. While the front side strong rinsing, fragile line features of integrated circuits suffered collapse, which affect the device yield substantially. On the other hand, the unwanted residual materials aggregated by a liquid film will form defects on the front side of the wafer, which also have huge impact on the functionality of the integrated circuits.

According to various embodiments of the present disclosures, a wafer cleaning process and an associated apparatus are provided to avoid line collapses and defects on the wafer. FIG. 1 is a front side view, a cross-sectional view, and a back side view of a wafer 100. Referring to FIG. 1, the wafer 100 includes a front side 120 and a back side 140. At the front side 120, integrated circuits with associated conductive routes are fabricated on a work piece region 122, and a front side edge region 124 lies outside the work piece region 122. Relatively, there are no integrated circuits fabricated on the back side 140 of the wafer 100, a back side edge region 142 is roughly near the outer boundary of the wafer 100 on its back side 140.

Continuing to the cross-sectional view of the wafer 100, as shown, a bevel region 160 is between the front side edge region 124 and the back side edge region 142. Even though there are no integrated circuits fabricated on the region 124, 142, and 160, the unwanted residual materials deposited on these regions may flake off or migrate to the work piece region 122, thus affect the functionality of the integrated circuits. Therefore, cleanness of the region 124, 142, and 160 is an important process in the semiconductor industry.

Figure 2:
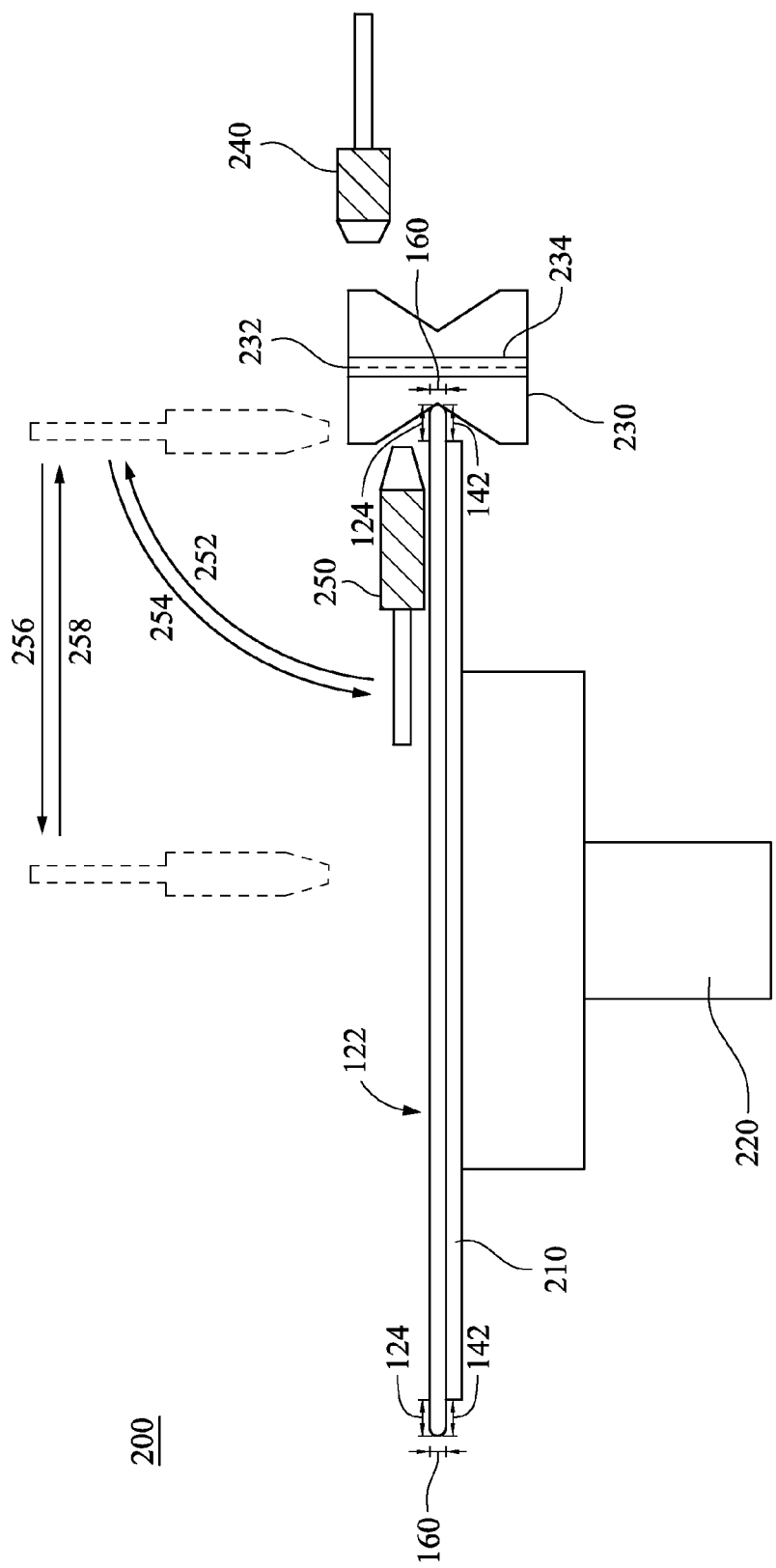
FIG. 2 is a cross-sectional view of a wafer cleaning apparatus in accordance with some embodiments.

As indicated, this disclosure pertains to remove the unwanted residual materials from the wafer 100. FIG. 2 is a cross-sectional view of a wafer cleaning apparatus 200. The wafer cleaning apparatus 200 includes a platform 210, a shaft 220, a cleaning brush 230, a first nozzle 240, and a second nozzle 250. The platform 210 supports the wafer 100 relative to the other components of the apparatus 200 for the next operation and structurally connected to a shaft 220, so that the platform 210 rotates at a certain speed when processed. A rotating speed of the platform 210 may rapidly accelerate or decelerate between 0 and about 3000 rpm.

The cleaning brush 230 is made of polyvinyl alcohol and may rotate around an axis 232. A rotating speed of the cleaning brush 230 rapidly accelerates or decelerates between 0 and about 500 rpm. The cleaning brush 230 configured to be disposed at an edge of the platform 210 and cleans the front side edge region 124, the back side edge region 142, and the bevel region 160 of the wafer 100. With bulges on the cleaning brush 230, the unwanted residual materials being scrubbed away from the region 124, 142, and 160. On the purpose to enhance the cleaning ability of the cleaning brush 230, the first nozzle 240 configured to be disposed above the cleaning brush 230 and delivers a first liquid stream on the cleaning brush 230 continuously to rinse the cleaning brush 230.

In embodiments, a pipe 234 is fabricated inside the cleaning brush 230. The pipe 234 provides the first liquid stream continuously, and the first liquid stream penetrates to a surface of the cleaning brush 230 and rinses the cleaning brush 230.

The second nozzle 250 configured to be disposed above the platform 210 and prevents liquid drops from the first nozzle 240 entering the work piece region 122. The first nozzle 240 continuously delivers the first liquid stream on the cleaning brush 230, and some liquid drops may flow or sputter onto the work pierce region 122 of the wafer 100. A first gas stream provided by the second nozzle 250 blows away these liquid drops and protects the work piece region 122 from liquid rinsing. To prevent the liquid drops entering the work piece region 122, the second nozzle 250 is tiltable at an angle with respect to the front side 120 of the wafer 100 and blows away the liquid drops entering the work piece region 122 from any direction. The angle between the second nozzle 250 and the front side 120 of the wafer 100 is in a range from about 0° to about 90°. In other words, the second nozzle tilts in a direction 252 or in a direction 254 to align the first gas stream over the front side 120 of the wafer 100 and blows away the liquid drops.

The second nozzle 250 is also moveable forth and back between a center and an edge of the front side 120 of the wafer 100 along a direction 256 or along a direction 258. For example, when the liquid drops sputter onto the work piece region 122, the second nozzle 250 moves to a region where the liquid drops will deposit and provides the first gas stream to blow away these liquid drops. The second nozzle 250 is tiltable during moving forth and back between the center and the edge of the front side 120 of the wafer 100, the angle between the second nozzle 250 and the wafer 100 is in a range from about 0° to about 90°.

In embodiments, the second nozzle 250 is disposed at a boundary between the work piece region 122 and the front side edge region 124, which delivers the first gas stream in the direction starting at the boundary of the work piece region 122 and the front side edge region 124 to the edge of the front side 120 of the wafer 100. The angle between the second nozzle 250 and the wafer 100 is about 0°.

Figure 3:
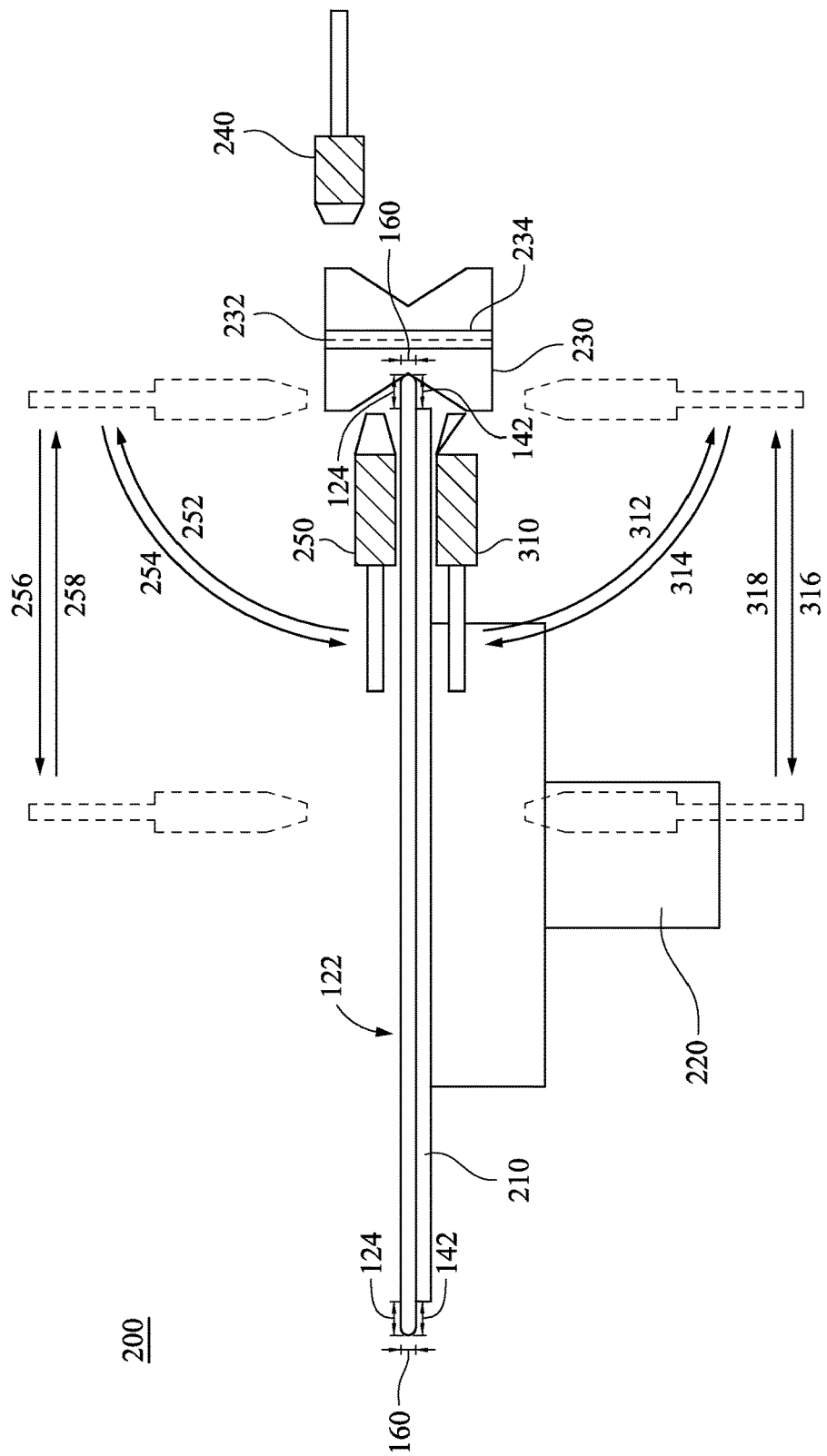
FIG. 3 is a cross-sectional view of a wafer cleaning apparatus in accordance with various embodiments.

FIG. 3 is a cross-sectional view of a wafer cleaning apparatus 300 according to various embodiments of the present disclosure. Comparing with the apparatus 200, a third nozzle 310 is applied in the apparatus 300 to enhance the cleaning ability of the back side 140 of the wafer 100.

The third nozzle 310 is tiltable at an angle with respect to the back side 140 of the wafer 100. An angle between the third nozzle 310 and the back side 140 of the wafer 100 is in a range from about 0° to about 90°. In other words, the third nozzle 310 tilts in a direction 312 or in a direction 314 to treat the back side 140 of the wafer 100.

The third nozzle 310 is also movable forth and back between a center and an edge of the back side 140 of the wafer 100 along a direction 316 or along a direction 318. The third nozzle 310 is tiltable during moving forth and back between the center and the edge of the back side 140 of the wafer 100, the angle between the third nozzle 310 and the wafer 100 is in a range from about 0° to about 90°.

In embodiments, the third nozzle 310 provides a second liquid stream to rinse the back side edge region 142. While the back side edge region 142 is fully rinsed with the second liquid stream, the unwanted residual materials on the back side edge region 142 are easy to be removed.

In embodiments, the third nozzle 310 provides a second gas stream to prevent the liquid drops entering the region inside the back side edge region 142. For the purpose to shorten the following drying operation after the cleaning process, the second gas stream blows away the liquid drops entering the region inside the back side edge region 142 from any direction on the back side 140 of the wafer 100.

Description of a wafer cleaning process is provided to understand the essence of the present disclosure. A wafer cleaning process 400 is provided in a flow chart of FIG. 4, which can be carried out by the apparatus 200 and 300 described in FIG. 2 and FIG. 3. To clarify description and avoid repetition, like numerals and letters used to describe above are used for the various elements in the coming figures. Also, reference numerals described previously may not be described again in detail herein.

Figure 4:
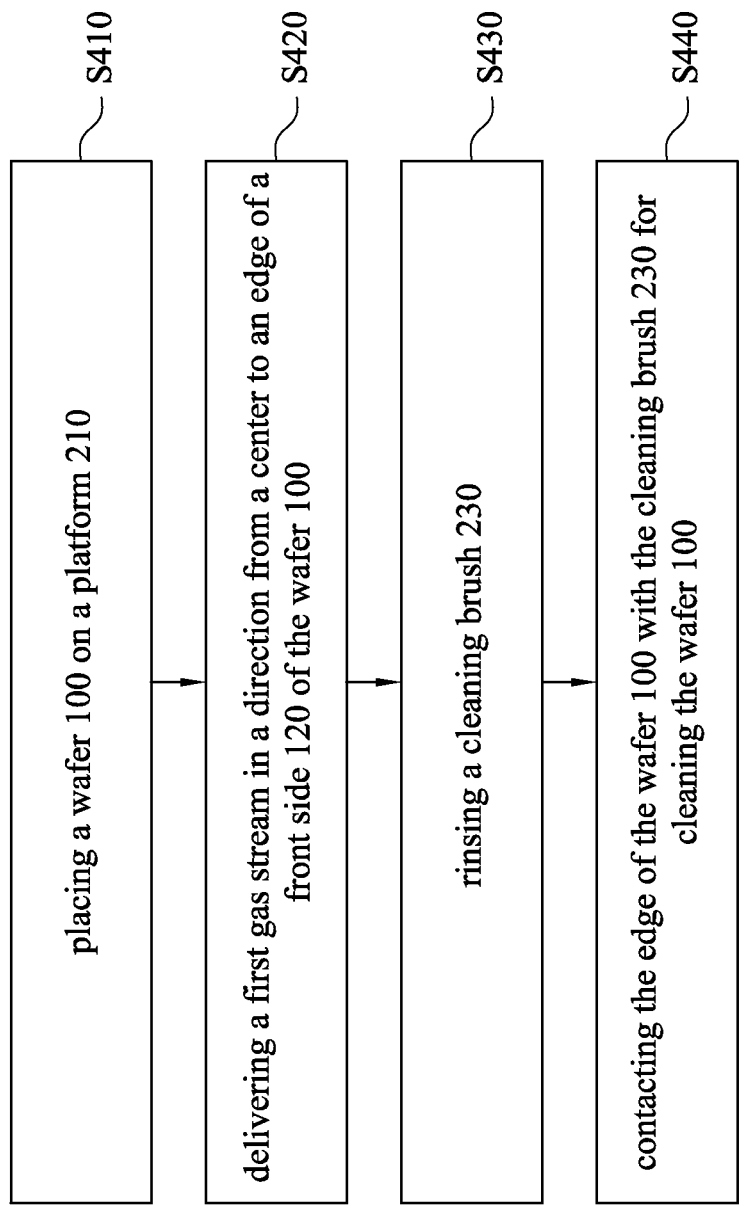
FIG. 4 is a flow chart of a wafer cleaning process in accordance with some embodiments.

As shown in FIG. 4 and referring to FIG. 2 and FIG. 3 to further clarify the present disclosure. Operation S410 begins with placing the wafer 100 on the platform 210 for the next operation. Referring to operation S420, the first gas stream is delivering in a direction from the center to the edge of the front side 120 of the wafer 100. During the wafer cleaning process 400, some liquid drops may flow or sputter onto the work piece region 122. These liquid drops will form a liquid film rinsing the work piece region 122, resulting in line collapses and device defects on the integrated circuits. The first gas stream provided by the second nozzle 250 here is adjustably aligned over the front side 120 of the wafer 100 and blows away the liquid drops entering the work piece region 122 from any direction, thus maintains and protects the integrity of the integrated circuits. The flow rate of the first gas stream is in a range from about 80 ml/min to about 120 ml/min.

Continuing to operation S430, rinsing the cleaning brush 230. The first liquid stream provided by the first nozzle 240 rinses the cleaning brush 230 and flushes away any unwanted residual materials on the cleaning brush 230, thus recovers the cleaning ability of the cleaning brush 230. The flow rate of the first liquid stream is in a range from about 300 ml/min to about 500 ml/min.

In embodiments, the pipe 234 fabricated inside the cleaning brush 230 also provides the first liquid stream continuously, and the first liquid stream penetrates to a surface of the cleaning brush 230 and rinses the cleaning brush 230.

Referring now to operation S440, contacting the edge of the wafer 100 with the cleaning brush 230 for cleaning the wafer 100. While the cleaning brush 230 contacting with the edge of the wafer 100, the first liquid stream provided by the first nozzle 240 also rinses the front side edge region 124, the back side edge region 142, and the bevel region 160. The bulges on the cleaning brush 230 scrub away the unwanted residual materials from region 124, 142, and 160, and these unwanted residual materials being removed quickly along with the first liquid stream, thus recovers the cleaning ability of the cleaning brush 230.

Figure 5:
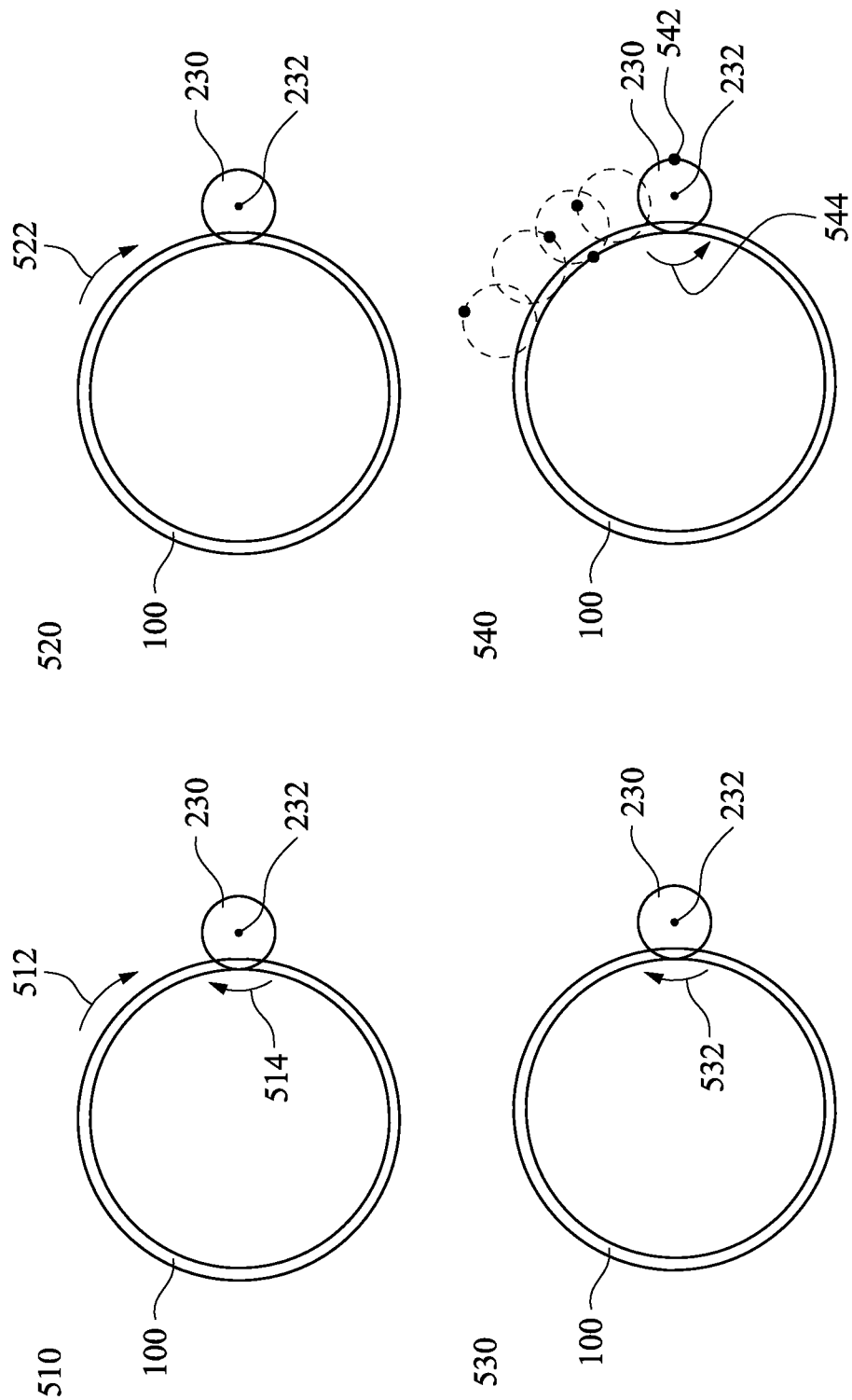
FIG. 5 is a front side view of different mechanisms for contacting an edge of a wafer with a cleaning brush in accordance with some embodiments.

FIG. 5 is a front side view of different mechanisms for contacting the edge of the wafer 100 with the cleaning brush 230. In mechanism 510, the platform 210 drives the wafer 100 rotating in a direction 512, and the cleaning brush 230 rotates in a direction 514 around the axis 232 at the edge of the wafer 100. The cleaning brush 230 contacts the wafer 100 with different surfaces and scrubs the unwanted residual materials from the edge of the wafer 100. Rotating directions 512 and 514 are both clockwise or both counterclockwise, but tangential velocity directions of the rotating direction 512 and 514 at contact surfaces are opposite. Thus, there exists a relative tangential velocity between the wafer 100 and the cleaning brush 230 at the contact surfaces, which enhances the cleaning ability of the cleaning brush 230. The rotating speed of the wafer 100 is in a range from about 200 rpm to about 500 rpm, and the rotating speed of the cleaning brush 230 is in a range from about 200 rpm to about 300 rpm.

As shown in mechanism 520, the platform 210 drives the wafer 100 rotating in a direction 522, and the cleaning brush 230 is stationary at the edge of the wafer 100 at least in the beginning. Owing to a friction force between the wafer 100 and the cleaning brush 230, the cleaning brush 230 will be driven by the rotating wafer 100 and starts rotating around the axis 232. Thus, without setting an extra driving force apparatus on the cleaning brush 230, the cleaning brush 230 rotates along with the rotating wafer 100 and cleans the edge of the wafer 100 with different contact surfaces. During mechanism 520, the rotating direction of the wafer 100 and the cleaning brush 230 are opposite. For example, the wafer 100 rotates clockwise and drives the cleaning brush 230 rotating counterclockwise, or the wafer 100 rotates counterclockwise and drives the cleaning brush 230 rotating clockwise. But at the contact surfaces, the wafer 100 and the cleaning brush 230 have the same tangential velocity. The rotating speed of the wafer 100 is in a range from about 200 rpm to about 500 rpm.

Mechanism 530 begins with rotating the cleaning brush 230 around its own axis 232 in a direction 532 at the edge of the wafer 100. The wafer 100 is stationary at least in the beginning, but the friction force between the wafer 100 and the rotating cleaning brush 230 will drive the wafer 100. Without a driving force provided by the platform 210, the wafer 100 will rotate along with the rotating cleaning brush 230. The rotating direction of the wafer 100 and the cleaning brush 230 are opposite. For example, the cleaning brush 230 rotates clockwise and drives the wafer 100 rotating counterclockwise, or the cleaning brush 230 rotates counterclockwise and drives the wafer 100 rotating clockwise. But at the contact surfaces, the wafer 100 and the cleaning brush 230 have the same tangential velocity. The rotating speed of the cleaning brush 230 is in a range from about 200 rpm to about 300 rpm.

Referring to mechanism 540, the wafer 100 is keeping stationary on the platform 210 with the cleaning brush 230 rolling along the edge of the wafer 100. A point 542 on the cleaning brush 230 is introduced to further clarify the mechanism 540. During mechanism 540, the wafer 100 is not rotating to avoid any wobble destructing the integrity of the integrated circuits, and the cleaning brush 230 is doing a circular motion along the edge of the wafer 100 and self-rotating around the axis 232. A relative position between the point 542 and the contact surfaces between the cleaning brush 230 and the wafer 100 is changing during the circular motion, which proves the cleaning brush 230 is self-rotating during the circular motion and cleans the wafer 100 with different contact surfaces. The cleaning brush 230 is doing a clockwise circular motion along the edge of the wafer 100 and rotating clockwise around the axis 232, or the cleaning brush 230 is doing a counterclockwise circular motion along the edge of the wafer 100 and rotating counterclockwise around the axis 232.

In embodiments, the rotation of the wafer 100 serves to distribute the applied liquid evenly over the edge of the wafer 100, and excess liquid also being removed due to a centrifugal force.

In embodiments, the rotating speed of the wafer 100 raises to a range from about 2000 rpm to about 3000 rpm after the wafer cleaning process 400. Higher rotating speed leads to a greater centrifugal force experienced by the liquid on the edge of the wafer 100 and removes large portion of liquid from the wafer 100.

In embodiments, the third nozzle 310 provided the second liquid stream to enhance the cleaning ability of the back side edge region 142. With the back side edge region 142 strong rinsing, the unwanted residual materials are easy to be removed along with the second liquid stream. The flow rate of the second liquid stream is in a range from about 300 ml/min to about 500 ml/min.

In embodiments, the first liquid stream and the second liquid stream are liquid streams independently selected from the group consisting of de-ionized water, sulfuric acid, hydrogen peroxide, and combination thereof.

In embodiments, the third nozzle 310 provided the second gas stream to prevent the liquid drops entering the region inside the back side edge region 142. For the purpose to shorten the following drying operation after the wafer edge cleaning process 400, the second gas stream adjustably aligned over the back side 140 of the wafer 100 for blowing away liquid drops entering the region inside the back side edge region 142 from any direction. The flow rate of the second gas stream is in a range from about 80 ml/min to about 120 ml/min.

In embodiments, the first gas stream and the second gas stream are gas streams independently selected from the group consisting of nitrogen, helium, argon, and combinations thereof, which are not reactive at standard temperature and pressure.

In embodiments, the first gas stream and the second gas stream are also used for drying the wafer 100. After the wafer edge cleaning process 400, removal of the remaining liquid from the wafer is necessary. The first gas stream and the second gas stream applied for previous operations are usable to evaporate residual liquid on the wafer 100.

In embodiments, the first nozzle 240 provides a third gas stream on the cleaning brush 230. The cleaning brush 230 scrubs the unwanted residual materials with a gas film formed by the third gas stream, and a negative pressure inhaling removed particles to protect the work piece region 122. In another embodiments, the second nozzle 250 above the platform 210 provides the negative pressure and inhales the removed particles. The third gas stream is independently selected from the group consisting of nitrogen, helium, argon, and combinations thereof.

The embodiments of the present disclosure discussed above have advantages over existing apparatus and processes, and the advantages are summarized below. In various embodiments, the front side edge region 124, the back side edge region 142, and the bevel region 160 of the wafer 100 could have better cleanness with the work piece region 122 fully dry on the front side 120 of the wafer 100. Without rinsing the work piece region 122, the integrated circuits thereon prevent suffering line collapses and avoid remaining defects.

On the other hand, the first liquid stream and the second liquid stream strongly rinse the front side edge region 124, the back side edge region 142, and the bevel region 160. With fully rinsing, the cleaning ability of the cleaning brush 230 increases significantly and removes the unwanted residual materials deposited on these regions efficiently. Since preparation of liquid streams and an accompanied sewage treatment operation for contaminated liquid streams are expensive, present disclosure reduces the amount of the liquid streams and saves the costs during the wafer cleaning process 400.

Besides, the first gas stream and the second gas stream prevent the liquid drops entering the unwanted region, for example, the work piece region 122 and the region inside the back side edge region 142. For the other purpose, after the wafer cleaning process 400, these gas streams may used to evaporate remaining liquid on the edge of the wafer 100. It is convenient to operate because nozzles 250 and 310 are adjustable to place at adequate regions, and no requirement to set up extra lines. Summarize above points, the higher efficiency wafer cleaning process 400 disclosed here protects the integrated circuits from line collapses and device defects, furthermore saving the cost of fabricating integrated circuits on the wafer 100.

In accordance with some embodiments, the present disclosure discloses a process for cleaning a wafer, the wafer having a front side and a back side. The process begins with placing the wafer on a platform and delivering a first gas stream in a direction from a center to an edge of the front side of the wafer, and a cleaning brush is rinsing and contacting the edge of the wafer for cleaning the wafer.

In accordance with various embodiments, the present disclosure discloses a process for cleaning a wafer, the wafer having a front side and a back side. The process begins with placing the wafer on a platform and rotating the wafer. An edge of the back side of the wafer and a cleaning brush is rising with de-ionized water. A nitrogen stream is delivering in a direction from a center to an edge of the front side of the wafer, and the cleaning brush is rotating at the edge of the wafer for cleaning the wafer.

In accordance with various embodiments, the present disclosure discloses an apparatus for cleaning a wafer. The apparatus includes a platform, and a first nozzle configured to be disposed above the platform. A cleaning brush configured to be disposed at an edge of the platform, and a second nozzle configured to be disposed above the cleaning brush.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process for cleaning a wafer, the wafer having a front side and a back side, the process comprising:
    placing the wafer on a platform;
    rotating the wafer;
    applying a liquid to a cleaning brush along a direction which extends from the cleaning brush to an edge of the wafer;
    providing a nozzle to deliver a first gas stream to the cleaning brush;
    tilting the nozzle from a first position above the cleaning brush to a second position parallel to the platform;
    after tilting the nozzle, blowing the cleaning brush by using the first gas stream that moves along a direction from a center of the wafer toward the edge of the wafer; and
    rotating the cleaning brush at the edge of the rotating wafer for cleaning the wafer.

2. The process of claim 1, wherein a rotating speed of the wafer is a range from about 200 rpm to about 500 rpm.

3. The process of claim 1, wherein a flow rate of the liquid is in a range from about 300 ml/min to about 500 ml/min.

4. The process of claim 1, wherein a flow rate of the first gas stream is in a range from about 80 ml/min to about 120 ml/min.

5. The process of claim 1, wherein a rotating speed of the cleaning brush is in a range from about 200 rpm to about 300 rpm.

6. The process of claim 1, wherein the front side of the wafer has a work piece region and a front side edge region surrounding the work piece region, and the first gas stream moves along a direction from the work piece region toward the front side edge region.

7. The process of claim 1, further comprising delivering a second gas stream on the back side of the wafer.

8. The process of claim 1, further comprising drying the wafer with the first gas stream.

9. The process of claim 1, wherein the liquid is independently selected from the group consisting of de-ionized water, sulfuric acid, hydrogen peroxide, and combinations thereof.

10. A process for cleaning a wafer, the wafer having a front side and a back side, the process comprising:
    placing the wafer on a platform;
    rotating the wafer;
    applying a liquid to a cleaning brush through a first nozzle, wherein the first nozzle is oriented such that the liquid moves along a direction extending from the cleaning brush to an edge of the wafer;
    providing a second nozzle to deliver a first gas stream to the cleaning brush;
    tilting the second nozzle from a first position above the cleaning brush to a second position parallel to the platform;
    after tilting the second nozzle, delivering the first gas stream to the cleaning brush through the second nozzle, wherein the second nozzle is oriented such that the first gas stream moves along a direction from a center of the wafer toward the edge of the wafer, and the first nozzle and the second nozzle are arranged on opposing sides of the cleaning brush; and
    rotating the cleaning brush at the edge of the rotating wafer for cleaning the wafer.

11. The process of claim 10, wherein the front side of the wafer has a work piece region and a front side edge region surrounding the work piece region, and the first gas stream goes along a direction from the work piece region toward the front side edge region.

12. The process of claim 10, further comprising delivering a second gas stream on the back side of the wafer.

13. The process of claim 10, further comprising drying the wafer with the first gas stream.

14. The process of claim 10, wherein the liquid is independently selected from the group consisting of de-ionized water, sulfuric acid, hydrogen peroxide, and combinations thereof.

15. The process of claim 10, further comprising:
tilting a third nozzle from a third position below the cleaning brush to a fourth position parallel to the platform; and
after tilting the third nozzle, providing a second gas stream to the cleaning brush.

16. A process for cleaning a wafer, the wafer having a front side and a back side, the process comprising:
placing the wafer on a platform;
rotating the wafer;
applying a liquid to a cleaning brush in a first direction;
providing a nozzle to deliver a first gas stream to the cleaning brush;
tilting the nozzle from a first position above the cleaning brush to a second position parallel to the platform;
after tilting the nozzle, delivering the first gas stream to the cleaning brush in a second direction, wherein the second direction extends from a center to an edge of the wafer, and the first direction extends from the cleaning brush to the edge of the wafer; and
rotating the cleaning brush at the edge of the rotating wafer for cleaning the wafer.

17. The process of claim 16, further comprising delivering a second gas stream on the back side of the wafer.

18. The process of claim 16, further comprising drying the wafer with the first gas stream.

19. The process of claim 16, wherein the liquid is independently selected from the group consisting of de-ionized water, sulfuric acid, hydrogen peroxide, and combinations thereof.

20. The process of claim 16, wherein the wafer and the cleaning brush are rotated in a same direction.

* * * * *